US010007353B2

(12) United States Patent
Giebeler et al.

(10) Patent No.: US 10,007,353 B2
(45) Date of Patent: Jun. 26, 2018

(54) SWITCH OPERATING DEVICE, MOBILE DEVICE AND METHOD FOR OPERATING A SWITCH BY A NON-TACTILE TRANSLATIONAL GESTURE

(71) Applicant: Pyreos Ltd., Edinburgh (GB)

(72) Inventors: Carsten Giebeler, Edinburgh (GB); Spyros Brown, Edinburgh (GB); Tim Chamberlain, Edinburgh (GB); Jonathan Ephraim David Hurwitz, Edinburgh (GB)

(73) Assignee: Pyreos Ltd., Edinburgh (GB)

( * ) Notice: Subject to any disclaimer, the term of this patent is extended or adjusted under 35 U.S.C. 154(b) by 1 day.

(21) Appl. No.: 14/949,993

(22) Filed: Nov. 24, 2015

(65) Prior Publication Data

US 2016/0077600 A1 Mar. 17, 2016

Related U.S. Application Data

(63) Continuation of application No. PCT/EP2014/060546, filed on May 22, 2014.
(Continued)

(51) Int. Cl.
*G06F 3/01* (2006.01)
*H03K 17/945* (2006.01)
(Continued)

(52) U.S. Cl.
CPC ............. *G06F 3/017* (2013.01); *G06F 3/012* (2013.01); *G06F 3/0308* (2013.01); *G06F 3/041* (2013.01); *H03K 17/945* (2013.01)

(58) Field of Classification Search
None
See application file for complete search history.

(56) References Cited

U.S. PATENT DOCUMENTS

| | | | |
|---|---|---|---|
| 4,912,748 A | 3/1990 | Horii et al. | |
| 2010/0204953 A1* | 8/2010 | Onishi | G06F 3/0304 702/150 |

(Continued)

FOREIGN PATENT DOCUMENTS

| | | |
|---|---|---|
| DE | 102009017845 A1 | 10/2010 |
| JP | H01084179 | 3/1998 |

(Continued)

OTHER PUBLICATIONS

International Search Report in counterpart International Application No. PCT/EP2014/060546, dated Aug. 8, 2014.
(Continued)

*Primary Examiner* — Kenneth B Lee, Jr.
(74) *Attorney, Agent, or Firm* — Edell, Shapiro & Finnan, LLC

(57) ABSTRACT

A switch operating device (100) configured to operate a switch (103) with four possible types (111 to 114) of non-tactile translational gestures performed with a heat emitting part (115). A gesture sensor (1) is adapted to detect heat emitted by the part while performing one of the translational gesture types. Four pixels (21 to 24) are arranged next to each other and output a signal (51 to 54) per pixel, wherein the signal has a signal deflection (58) corresponding to the temporal intensity curve of the heat detected by the thin film of the corresponding pixel. A signal processing unit (101) determines the performance of the translational gesture types from the temporal succession of the signal deflections (58). An actuator (104) is controlled by the signal processing unit and operates the switch when one of the translational gesture types is determined.

15 Claims, 3 Drawing Sheets

Related U.S. Application Data

(60) Provisional application No. 61/827,108, filed on May 24, 2013.

(51) Int. Cl.
    *G06F 3/03*    (2006.01)
    *G06F 3/041*    (2006.01)

(56) References Cited

U.S. PATENT DOCUMENTS

| | | |
|---|---|---|
| 2010/2004953 | 8/2010 | Onishi et al. |
| 2010/0295773 A1* | 11/2010 | Alameh ............ H03K 17/9631 345/156 |
| 2011/0050643 A1 | 3/2011 | Zhao et al. |
| 2012/0132807 A1 | 5/2012 | Giebeler et al. |
| 2012/0211658 A1 | 8/2012 | Giebeler et al. |

FOREIGN PATENT DOCUMENTS

| | | |
|---|---|---|
| JP | 2003130728 A | 5/2003 |
| JP | 2008232715 A | 10/2008 |
| JP | 2010211781 A | 9/2010 |
| JP | 2012112731 A | 6/2012 |
| WO | 9309414 A1 | 5/1993 |
| WO | 2011018253 A1 | 2/2011 |

OTHER PUBLICATIONS

Office Action in corresponding Japanese Application 2016514411, dated Mar. 5, 2018, along with English translation.

* cited by examiner

SWITCH OPERATING DEVICE, MOBILE DEVICE AND METHOD FOR OPERATING A SWITCH BY A NON-TACTILE TRANSLATIONAL GESTURE

CROSS-REFERENCE TO RELATED APPLICATIONS

This application is a Continuation of International Application No. PCT/EP2014/060546, filed on May 22, 2014, which claims benefit under 35 U.S.C. § 119(e) to U.S. Provisional Application No. 61/827,108, filed May 24, 2013. The disclosures of both related applications are considered part of and are incorporated by reference into the disclosure of the present application in their respective entireties.

FIELD OF THE INVENTION

The invention relates to a switch operating device, a mobile device with the switch operating device and a method for operating a switch with the switch operating device by a non-tactile translational gesture, in particular from a human hand.

BACKGROUND

Interactive systems and their human being-machine-interfaces are known for the human being-computer-interaction, wherein the human being-machine-interfaces are provided with a device for the automatic recognition of non-tactile or tactile gestures performed by human beings. The gesture can principally be derived from every posture and every movement of the body, wherein hand gestures have most importance. The gesture recognition device is provided with a device for the optical acquisition in particular of the gesticulating hand, wherein the image information generated thereby is processed with corresponding algorithms in order to derive a gesture out of the image information. The device for the optical acquisition of a non-tactile gesture is conventionally a camera that disadvantageously takes a large space and involves high investment costs. Camera-based devices for the gesture recognition in miniaturized design with low costs, which would be for example advantageous for the use in mobile phones, are therefore not to be realized. Furthermore, camera-based devices have disadvantageously a high energy consumption, whereby mobile applications can only be realized with difficulty. High-speed spectrometers are alternatively known, which cannot provide remedy with respect to the miniaturized design with low costs. Touch screens in particular for mobile telephones are furthermore known, however the touch screens are suitable only for the recognition of tactile gestures and not for the recognition of non-tactile gestures.

SUMMARY

It is an object of the invention to provide a switch operating device, a mobile device with the switch operating device and a method for operating a switch with the switch operating device by a non-tactile translational gesture, wherein the switch operating device has a miniaturized design with low costs and low energy consumption and the operation of the switch with the switch operating device is secure and has few errors.

The switch operating device according to the invention for operating a switch by four possible types of non-tactile translational gestures that are to be performed with a part emitting heat comprises a gesture sensor that is adapted to detect heat emitted by the part during performing one of the types of the translational gestures by four pixels arranged next to each other and to output a signal per pixel that respectively comprise a thin film of pyroelectric sensitive material, wherein the signal has a signal deflection corresponding to the temporal intensity curve of the heat detected by the thin film of the corresponding pixel, a signal processing unit with which the performance one of the types of the translational gestures can be determined out of the temporal succession of the signal deflections, and an actuator that is controlled by the signal processing unit and operates the switch as soon as the performance one of the types of the translational gestures is determined, wherein a first type of the translational gestures is defined by a movement of the part in a longitudinal direction, a second type of the translational gestures is defined by a movement of the part against the longitudinal direction, a third type of the translational gestures is defined by a movement of the part in a transverse direction deviating from the longitudinal direction and a fourth type of the translational gestures is defined by a movement of the part against the transverse direction and four of the pixels are respectively arranged in the corners of a convex tetragon, wherein one of the diagonals thereof is substantially parallel to the longitudinal direction and the other diagonal thereof is substantially parallel to the transverse direction.

The mobile device according to the invention comprises the switch operating device, wherein the switch is interconnected in the mobile device for the activation/deactivation of a functionality of the mobile device.

The method according to the invention for operating the switch operating device comprises: performing one type of the possible translational gestures with the part emitting heat, so that the succession of the signal deflections is output from the pixels to the signal processing unit; via the succession of the signal deflections: identifying the first affected pixel and the last affected pixel; verifying, if the signal deflections of the other two pixels are temporarily arranged between the signal deflections of the first affected pixel and the last affected pixel; if the verification is positive, proceeding with the method; assigning the diagonal formed by the first affected pixel and the last affected pixel to the longitudinal direction or to the transverse direction, depending on to which direction the diagonal is more parallel, and taking into account the sequence of affection of the first affected pixel and the last affected pixel, so that the type of the performed translational gesture is identified as the first, the second, the third or the fourth type; depending on the identified type of translational gesture: controlling correspondingly the actuator for operating the switch by the signal processing unit. The pyroelectric material is preferably lead-zirconate-titanate.

Because the pixels respectively comprise the thin film made out of the pyroelectric material, in particular lead-zirconate-titanate, the signals generated by the part emitting heat during performing the non-tactile translational gestures are advantageously obtained with the method according to the invention such that the recognition of the type of the performed translational gesture can be carried out securely and has few errors. Furthermore, the gesture sensor with the pixels can be made in a miniaturized design with low costs such that the switch operating device can advantageously be used for mobile devices. The signal is generated with the thin films by the heat emitted by the part, so that the gesture sensor does not need to be supplied with energy by an external energy source. The switch operating device therefore comprises the signal processing unit and the actuator as energy consumer so that the energy consumption of the switch operating device for the mobile device is altogether advantageously low.

The tetragon is preferably a rhombus. The distance of two immediately adjacent pixels is preferably from 50 μm to 300 μm. It is furthermore preferred that the part is a human hand and the heat emitted from the part is the body heat radiated by the human hand. The recognition of the type of the performed non-tactile translational gesture with the human hand with the preferred embodiments of the switch operating device is enabled to be particularly secure and has few errors within the scope of usual human motion sequences.

The method for operating the switch operating device preferably comprises: verifying, if the absolute values of all four signal deflections are above a predetermined level; if the verification is positive, proceeding with the method. It is therefore advantageously achieved that noise that for example is released by influences out of the surroundings of the pixels does not affect the gesture processing, whereby the accuracy of the gesture recognition is increased.

It is furthermore preferred that the method for operating the switch operating device comprises: verifying, if the temporal delay of the signal deflections that are arranged temporally between the signal deflections of the first affected pixel and the last affected pixel are within a first predetermined delay duration; if the verification is positive, proceeding with the method. It is particularly preferred that the first predetermined delay duration is 0.5 ms. The intermediate signal deflections that occur temporally after the first signal deflection and temporally before the last signal deflection are thus supposed to occur within the delay duration of 0.5 ms, whereby the degrees of the simultaneousness of the occurrence of the intermediate signal deflections are defined for the gesture recognition that is secure and has few errors.

The method for operating the switch operating device preferably comprises furthermore: verifying, if the temporal first signal deflection is arranged at least a second predetermined delay duration before the temporal second or third signal deflection and the temporal fourth signal deflection is arranged at least the second predetermined delay duration after the temporal second or third signal deflection; if the verification is positive, proceeding with the method. It is particularly preferred that the second predetermined delay duration is between 7 ms and 40 ms. The temporal advance of the first signal deflection and the temporal lag of the last signal deflection in relation to the intermediate signal deflections are defined by the second predetermined delay duration for the gesture recognition that is secure and has few errors.

The verification, if the temporal delay of the intermediate signal deflections is within the first predetermined delay duration and if the temporal advance of the first signal deflection and the temporal lag of the last signal deflection in relation to the intermediate signal deflections are respectively within the second predetermined delay duration enables the processing of the direction of the non-tactile translation gesture. In case one of the verifications or both verifications are positive, the type of the performed translational gesture can be determined securely and has few errors, namely if the performed translational gesture has the first, the second, the third or the fourth type. However, if one of the verifications or both verifications are negative, the translational gesture was not performed in the direction provided therefore, whereby this translational gesture cannot be identified as one of the four types and is therefore rejected. The directions provided for the translational gestures are substantially parallel to the longitudinal direction or substantially parallel to the transverse direction.

It is preferred that either the amplitude curves of the signals output by the pixels or the first temporal derivative of the amplitude curves of the signals output by the pixels are used for the signal deflections. In particular when using the temporal derivative of the amplitude curves it is surprisingly observed that an even sharper and more error tolerant recognition of the types of the translational gestures is enabled, whereby the gesture recognition with the switch operating device according to the invention and the method according to the invention for operating the switch operating device is even more secure and has fewer errors.

According to the invention, the pixels respectively comprise the thin film out of the pyroelectric material, preferably lead-titanate-zirconate. The approach of the part to each pixel and the withdrawal of the part from each pixel involve the respective signal deflection in S-shape that has a sinus form, as it is in particular shown in FIG. 3. The method for operating the switch operating device preferably comprises: identifying the shape of the signal deflections and verifying, if the shapes of the signal deflections respectively have the S-shape; if the verification is positive, proceeding with the method. Because the pixels respectively comprise the thin film out of the pyroelectric material, preferably lead-zirconate-titanate, the characteristic S-shape of the signal deflections is generated during approximation of the part and during the withdrawal of the part, wherein the S-shape is used for the verification if the performed translational gesture is one of the four types. Signal deflections that for example have no S-shape are therefore interpreted such that none of the translational gestures of the four types is performed. By using the shape of the signal deflections and the verification if the signal deflections have the S-shape, an increase of the precision of the gesture recognition is surprisingly achieved.

It is particular preferred that the temporal occurrence of the maxima and/or minima of the S-shaped signal deflections of the signals of the pixels are used for the verifications. The maxima and/or minima of the S-shaped signal deflections of the signals can be easily and precisely determined by the signal processing unit. Among other things, it is therefore enabled to provide the gesture recognition for the non-tactile translational gestures with the switch operating device and the method for operating the switch operating device, wherein the switch operating device has such a miniaturized design with low costs and low energy consumption that the switch operating device is particularly suited for the mobile device. The recognition of one of the four types of a performed non-tactile translational gesture with the mobile device is sufficiently secure and has sufficiently few errors.

BRIEF DESCRIPTION OF THE DRAWINGS

In the following a preferred embodiment of the invention is explained on the basis of schematic drawings, which show.

DETAILED DESCRIPTION

Figure 1:
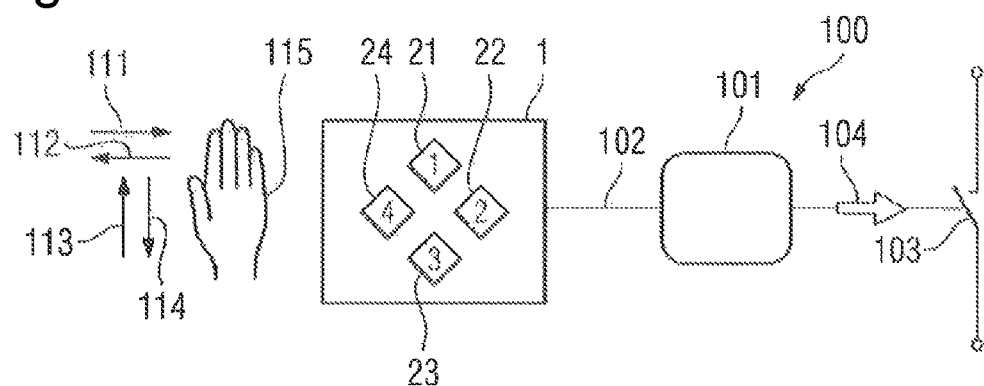
FIG. 1 a schematic illustration of a switch operating device according to the invention for a mobile device according to the invention, FIG. 2 a schematic illustration of a gesture sensor, FIG. 3 a diagram with amplitude curves of signals of the gesture sensor from FIG. 2, FIG. 4 a diagram with the first temporal derivative of the amplitude curves from FIG. 3, FIG. 5 a detailed view of FIG. 3, and FIG. 6 a diagram with a calculation rule for the formation of the first temporal derivative of the amplitude curves as shown in FIG. 4.

In FIG. 1 a switch operating device 100 is shown that is built in a mobile device. The switch operating device 100 comprises a gesture sensor 1 and a signal processing unit 101 that is coupled via a signal line 102 for transferring signals from the gesture sensor 1 to the signal processing unit 101. According to the processing of the signals that are transferred from the gesture sensor 1 to the signal processing unit 101 the signal processing unit 101 activates or deactivates an actuator 104, with which a switch 103 of the mobile device can be operated. The switch 103 is interconnected in the mobile device for activating/deactivating a functionality of the mobile device.

The gesture sensor 1 is provided for detecting non-tactile translational gestures, wherein, according to which translational gesture the gesture sensor 1 detects, a signal or a plurality of signals are transferred to the signal processing unit 101 via the signal line 102, on which basis the operation of the switch 103 can be accomplished via the actuator 104. The operation of the switch 103 is only then triggered when one of four types of translational gestures 111 to 114 is identified by the gesture sensor 1 and the signal processing unit 101.

The translational gestures are to be performed non-tactile by a hand 115 in the proximity of the gesture sensor 1, wherein heat emitted by the hand 115 can be detected by the gesture sensor 1. As seen in FIG. 1, the translational gesture of the first type 111 is a movement of the hand 115 from left to right, the translational gesture of the second type 112 is a movement of the hand 115 from right to left, the translational gesture of the third type 113 is a movement of the hand 115 from down to up and the translational gesture of the fourth type 115 is a movement of the hand 115 from up to down.

Figure 2:
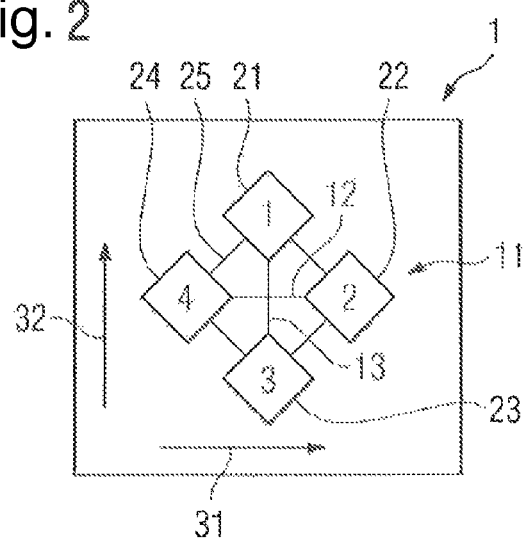

In FIG. 2 a schematic illustration of the gesture sensor 1 is shown, wherein the gesture sensor comprises a rhombus 11 with a longitudinal diagonal 12 and a transverse diagonal 13, wherein a respective pixel 21 to 24 is arranged in each corner of the rhombus 11. As seen in FIG. 2, the first pixel 21 is arranged in the upper corner of the rhombus 11, the second pixel 22 is arranged in the right corner of the rhombus 11, the third pixel 23 is arranged in the lower corner of the rhombus 11 and the fourth pixel 24 is arranged in the left corner of the rhombus 11. The distance 25 of two immediately adjacent pixels is between 50 µm to 300 µm. A longitudinal direction 31 that is oriented horizontally in FIG. 2 is parallel to the longitudinal diagonal 12 that is formed by the fourth pixel 24 and by the second pixel 22. A transverse direction 32 as seen in FIG. 2 is parallel to the transverse diagonal 13 that is formed by the first pixel 21 and by the third pixel 23. The translational gestures of the first type 111 and of the second type 112 are parallel to the longitudinal direction 31, whereas the translational gestures of the third type 113 and of the fourth type 114 are parallel to the transverse direction 32, wherein the translational gestures of the first type 111 and of the second type 112 have opposite directions and the translational gestures of the third type 113 and of the fourth type 114 have opposite directions.

Figure 3:
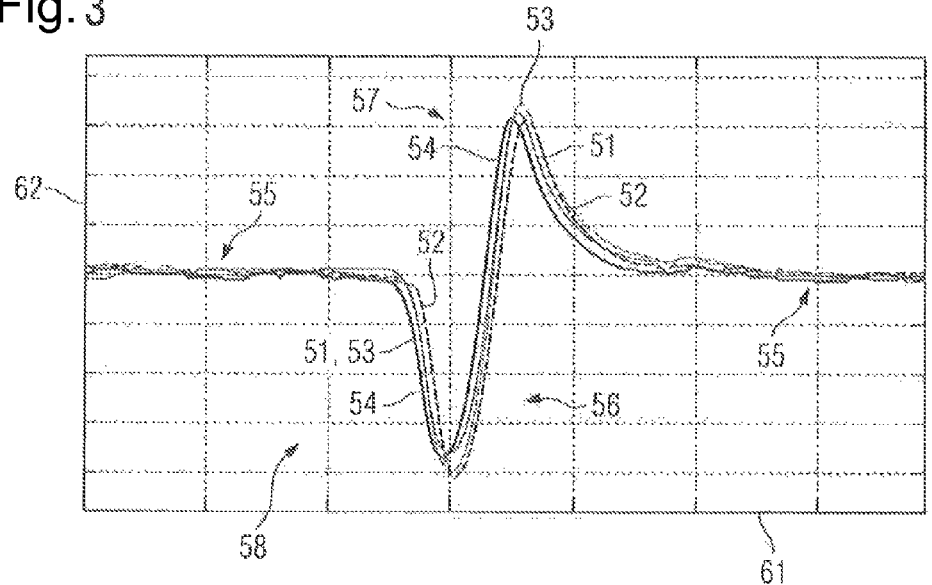

The pixels 21 to 24 respectively comprise a thin film out of lead-zirconate-titanate, with which the signal is generated as soon as the respective pixel 21 to 24 detects heat emitted by the hand 115. The signal with a signal deflection 58 corresponding to the temporal intensity curve of the heat detected by the thin film of the corresponding pixel 21 to 24 is thus output from each pixel 21 to 24 to the signal processing unit 101 during performing one of the translational gestures with the hand 115. The signal of the first pixel 21 is denoted with the reference sign 51, the signal of the second pixel 22 is denoted with the reference sign 52, the signal of the third pixel 23 is denoted with the reference sign 53 and the signal of the fourth pixel 24 is denoted with the reference sign 54. In FIG. 3 a diagram with the temporal amplitude curves of the signals 51 to 54 being output by the pixels 21 to 24 is shown, wherein the time is plotted over the abscissa 61 and the amplitude is plotted over the ordinate 62. The signals 51 to 54 respectively comprise an S-shape, wherein a first part 56 of the S-shape of the signal deflection is generated during an approach of the hand 115 to the gesture sensor 1 and a second part 57 of the S-shape of the signal deflection following the first part 56 is generated during a withdrawal of the hand 115 from the gesture sensor 1. A signal level 55 during pixel passivity that arises when no heat emitted by the hand 115 is detected by the gesture sensor 1 is formed before the first part 56 of the S-shape of the signal deflection and after the second part 57 of the S-shape of the signal deflection.

Figure 4:
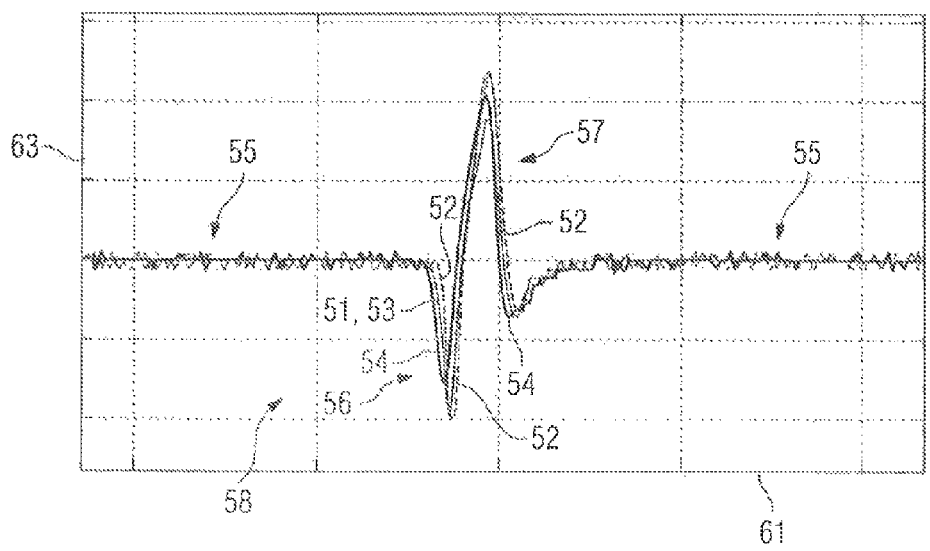
Figure 6:
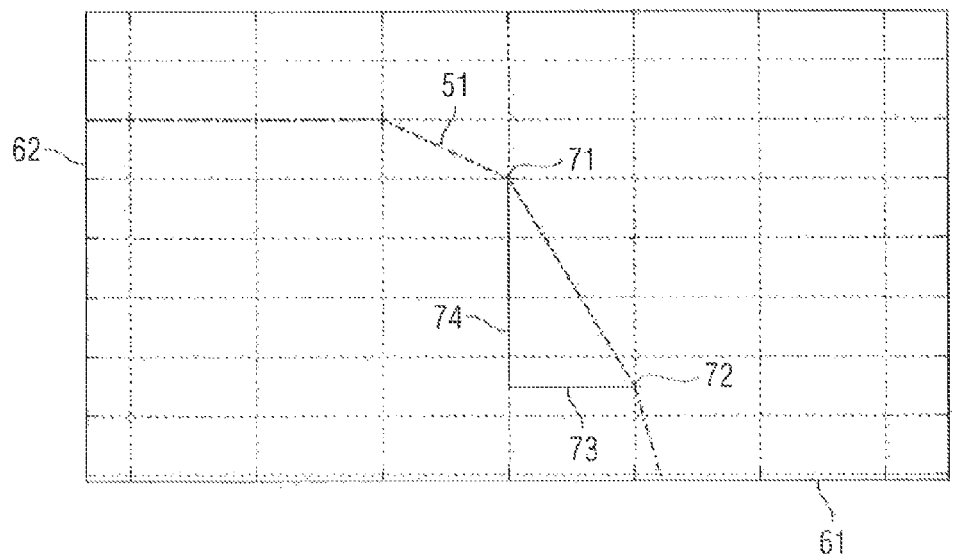

Alternatively to FIG. 3, in FIG. 4, the first temporal derivative of the amplitude curves of FIG. 3 is plotted over the ordinate 63. A representative detail of one of the signals 51 to 54 is shown in FIG. 6, wherein the amplitude of this signal is plotted over the time. The amplitude curve is in particular formed by a first sampling point 71 and a second sampling point 72, wherein the sampling points 71 and 72 are temporally delayed by a time increment 73 with respect to each other and an amplitude difference 74 is formed between the sampling points 71 and 72. The temporal derivative is to be performed discrete with a quotient out of the amplitude difference 74 and the time increment 73.

Figure 5:
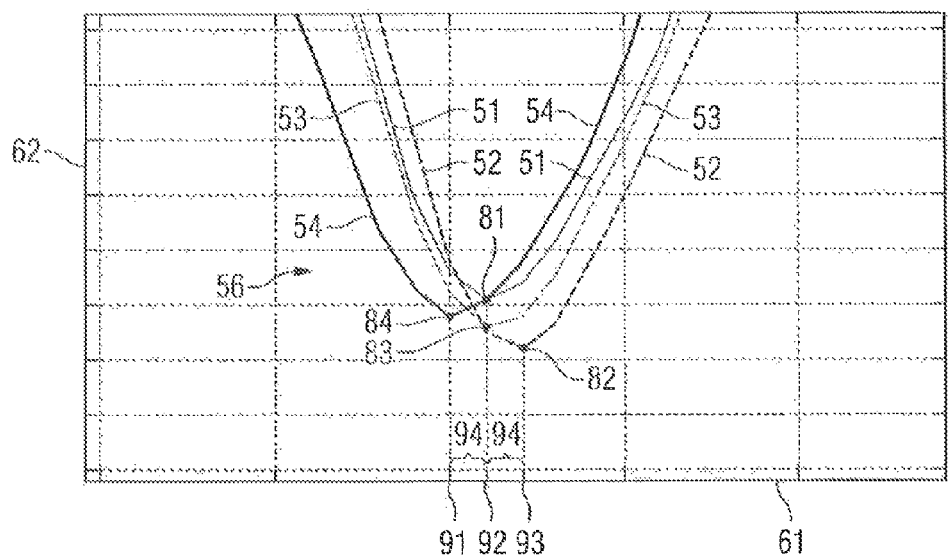

A detail from FIG. 3 is shown in FIG. 5, wherein the first part 56 of the S-shape of the signal deflection during approximation is illustrated magnified. The curves of the amplitudes of the signals 51 to 54 are shown, wherein each of the amplitude curves comprises a respective minimum 81 to 84. The signals 51 to 54 are generated by the translational gesture of the first type 111. During performing the translational gesture of the first type 111, first the fourth pixel 24, then simultaneously the first pixel 21 and the third pixel 23 and finally the second pixel 22 are passed by the hand 115. A corresponding temporal delay of the signal 51 to 54 therefore results, so that the signal 54 of the fourth pixel 24 is the temporal first signal and the signal 52 of the second pixel 22 is the temporal last signal. The signals 52 and 53 of the second pixel 22 and the third pixel 23 are arranged temporally between the signals 51 and 54. This temporal sequence of arrangement of the signals 51 to 54 reflects also in the arrangement of the minima 81 to 84, so that the fourth minimum 84 occurs first and the second minimum 82 occurs last, wherein the first minimum 81 and the third minimum 83 are arranged between the minima 84 and 82.

The translational gesture of the first type 111 is performed such that the hand 115 is moved parallel to the longitudinal direction 31 and perpendicular to the transverse direction 32. The hand 115 is therefore first detected by the fourth pixel 24 and last detected by the second pixel 22, wherein the detection of the hand 115 by the third pixel 23 and the first pixel 21 is arranged therein between. Since the translational gesture of the first type 111 is perpendicular to the transverse direction 32, the first pixel 21 and the third pixel 23 simultaneously detect the hand 115, so that the signals 51 and 53 are substantially arranged upon each other and the corresponding minima 81 and 83 occur substantially simultaneously. The occurrence of the fourth minimum 84 is denoted in FIG. 5 with a first point in time 91, the occurrence of the first minimum 81, respectively the third minimum 83 is denoted with a second point in time 92 and the occurrence of the second minimum 82 is denoted with a third point in time 93. A respective temporal delay 94 is arranged between the first point in time 91 and the second point in time 92 as well as between the second point in time 92 and the third point in time 93.

Arbitrary gestures can be performed by the hand 115 during the operation of the switch operating device 100. However, it is provided such that the switch 103 is supposed to be operated only during performing a translational gesture of one of the four types 111 to 114. It is therefore necessary to identify the presence of a translational gesture of one of the four types 111 to 114 out of a plurality of possible translational gestures and interferences out of the surroundings of the switch operating device 100.

The signals 51 to 54 are transferred from the gesture sensor 1 to the signal processing unit 101 for the identification of the performed translational gesture. It is verified in the signal processing unit 101 if the signals 51 to 54 have an S-shape and if first an amplitude deflection downwards and then upwards is present in the temporal curve, which means, if first the minima 81 to 84 of the signals 51 to 54 occur and then their maxima. In case this verification turns out positive, the signals 51 to 54 are used for the identification of the translational gesture. It is also conceivable that the pixels 21 to 24 are interconnected such that during performing the same translational gesture first the maxima and then the minima occur. It is additionally verified in the signal processing unit 101, if the absolute values of all four minima 81 to 84 of the first part 56 of the S-shape of the signal deflection during approximation of the hand 115 and of the four maxima of the second part 56 of the S-shape of the signal deflection during withdrawal of the hand 115 are above a predetermined amplitude level. The predetermined amplitude level is chosen such that expected interference signals out of the surroundings of the gesture sensor 1 are below the predetermined amplitude level.

The distance between two of the pixels 21 to 24 that are arranged immediately adjacent is between 50 µm to 300 µm. Because of the usual motion velocities of the hand 115, the identification of the type 111 to 114 of the translational gesture, respectively a rejection of the translational gesture as not belonging to one of the types 111 to 114 is enabled with the temporal succession of the minima 81 to 84, respectively their corresponding maxima. The functioning of the signal processing unit 101 is explained in the following on the basis of the identification of the translational gesture of the first type 111. The identification of the translational gestures of the other types 112 to 114 is analogue.

It is verified in the signal processing unit 101, if the temporal delay of the minimum 81 of the first pixel 21 and the minimum 83 of the third pixel 23 or the temporal delay of the minimum 82 of the second pixel 22 and the minimum 84 of the fourth pixel 24 are within a temporal duration of 0.5 ms. If this is the case for none of the pixel pairs 21, 23 and 22, 24, the signal detected by the gesture sensor 1 is to be rejected as not belonging to a translational gesture of one of the four types 111 to 114. If, for example, it is determined in the signal processing unit 101 that the first minimum 81 of the first pixel 21 and the third minimum 83 of the third pixel 23 occur within 0.5 ms, it is therefore derived that either a translational gesture of the first type 111 or a translational gesture of the second type 112 is present. It is then verified in the signal processing unit 101, if the fourth minimum 84 of the fourth pixel 24 is arranged before, respectively after the minima 81 and 83 of the pixels 21 and 23, respectively thereafter, and the second minimum 82 of the second pixel 22 is arranged after the minima 81 and 83 of the pixels 21 and 23 or therebefore.

In case the verification in the signal processing unit 101 results in that the fourth maximum 84 is arranged 7 ms to 40 ms before the first minimum 81 or the third minimum 83, depending on which of the minima 81, 83 occurs earlier, and the second minimum 82 is arranged 7 ms to 40 ms after the first minimum 81 or the third minimum 83, depending on which of the minima 81, 83 occurs later, the translational gesture detected by the gesture sensor 1 is identified as a translational gesture of the first type 111. According to how it is stored in the signal processing unit 101, the switch 103 is operated via the actuator 104. Gestures that are not identified as belonging to one of the four types 111 to 114 are rejected and the signal processing unit 101 and do not cause an operation of the switch 103. The identification of a translational gesture of the second to the fourth type 112 to 114 takes place in an analogous manner. Principally, any arbitrary combination of the verifications is conceivable in every arbitrary sequence.

| List of Reference Signs | |
|---|---|
| 1 | gesture sensor |
| 11 | rhombus |
| 12 | longitudinal diagonal |
| 13 | transverse diagonal |
| 21 | first pixel |
| 22 | second pixel |
| 23 | third pixel |
| 24 | fourth pixel |
| 25 | distance of two adjacent pixels |
| 31 | longitudinal direction |
| 32 | transverse direction |
| 51 | signal of the first pixel |
| 52 | signal of the second pixel |
| 53 | signal of the third pixel |
| 54 | signal of the fourth pixel |
| 55 | signal level during pixel passivity |
| 56 | first part of the S-shape of the signal deflection during approximation |
| 57 | second part of the S-shape of the signal deflection during withdrawal |
| 58 | signal deflection |
| 61 | abscissa: time |
| 62 | ordinate: amplitude |
| 63 | ordinate: first temporal derivative of the amplitude |
| 71 | first sampling point |
| 72 | second sampling point |
| 73 | time increment |
| 74 | amplitude difference |
| 81 | first minimum |
| 82 | second minimum |
| 83 | third minimum |
| 84 | fourth minimum |
| 91 | first point in time |
| 92 | second point in time |
| 93 | third point in time |
| 94 | temporal delay |
| 100 | switch operating device |
| 101 | signal processing unit |
| 102 | signal line |
| 103 | switch |
| 104 | actuator |
| 111 | translational gesture of the first type |
| 112 | translational gesture of the second type |

-continued

| List of Reference Signs | |
|---|---|
| 113 | translational gesture of the third type |
| 114 | translational gesture of the fourth type |
| 115 | hand |

What is claimed is:

1. A switch operating device adapted to operate a switch in response to any one of four types of non-tactile translational gestures that are performed with a heat emitting part, wherein the switch operating device comprises:
a gesture sensor adapted to detect heat emitted by the part while one of the types of the translational gestures is performed, with at least four pixels arranged in defined relationship to each other and to output a respective signal per pixel, wherein each of the pixels comprises a thin film that comprises pyroelectrically sensitive material, and wherein the each said signal exhibits a respective signal deflection corresponding to a respective temporal intensity curve of the heat detected by the thin films of the respective pixels,
a signal processing unit with which performance of any one of the types of the translational gestures is determined from a temporal succession exhibited by the respective signal deflections, wherein the temporal succession stems from temporal delays in the signal deflections relative to one another, and
an actuator controlled by the signal processing unit and adapted to operate the switch when the one of the types of the translational gestures is determined,
wherein a first type of the translational gestures is defined by a movement of the part in a longitudinal direction, a second type of the translational gestures is defined by a movement of the part against the longitudinal direction, a third type of the translational gestures is defined by a movement of the part in a transverse direction deviating from the longitudinal direction and a fourth type of the translational gestures is defined by a movement of the part against the transverse direction, and wherein four of the pixels are respectively arranged in corners of a convex tetragon, wherein one diagonal of the tetragon is substantially parallel to the longitudinal direction and the other diagonal of the tetragon is substantially parallel to the transverse direction.

2. The switch operating device according to claim 1, wherein the pyroelectric material is lead-zirconate-titanate.

3. The switch operating device according to claim 1, wherein the tetragon is a rhombus.

4. The switch operating device according to claim 1, wherein a distance of two immediately adjacent pixels is between 50 µm and 300 µm.

5. The switch operating device according to claim 1, wherein the part is a human hand and the heat emitted from the part is body heat radiated by the human hand.

6. A mobile device having a switch operating device according to claim 1, wherein the switch is interconnected in a mobile device to alternately activate and deactivate a functionality of the mobile device.

7. A method for operating a switch operating device according to claim 1, comprising:
outputting the signal deflections from the pixels to the signal processing unit in response to the detection of the heat while one of the types of the translational gestures is performed;
identifying a temporally first pixel and a temporally last pixel that detect the heat emitted by the part through the temporal succession exhibited by the signal deflections;
proceeding with the method if the signal deflections of the two pixels other than the temporally first pixel and the temporally last pixel are arranged temporarily between the signal deflections of the temporally first pixel and the temporally last pixel;
assigning the diagonal of the tetragon formed by the temporally first pixel and the temporally last pixel either to the longitudinal direction or to the transverse direction according to a determination of which of the diagonals more parallels the direction, taking into account the succession of the temporally first pixel and the temporally last pixel, so that the type of the performed translational gesture is identified as the first, the second, the third or the fourth type; and
controlling the actuator to operate the switch via the signal processing unit in accordance with the identified type of the translational gestures.

8. The method according to claim 7, further comprising:
proceeding with the method if absolute values of all four signal deflections are above a predetermined level.

9. The method according to claim 7, further comprising:
proceeding with the method if the temporal delays in the signal deflections that are arranged temporally between the signal deflections of the temporally first pixel and the temporally last pixel are within a first predetermined delay duration.

10. The method according to claim 9, wherein the first predetermined delay duration is 0.5 ms.

11. The method according to claim 9, further comprising:
proceeding with the method if the temporally first signal deflection is delayed by at least a second predetermined delay duration before the temporally second signal deflection or the temporally third signal deflection and the temporal fourth signal deflection is delayed by at least the second predetermined delay duration after the temporally second signal deflection or the temporally third signal deflection.

12. The method according to claim 11, wherein the second predetermined delay duration is between 7 ms and 40 ms.

13. The method according to claim 7, wherein either the amplitude curves of the signals output by the pixels or the first temporal derivative of the amplitude curves of the signals output by the pixels are used for the signal deflections.

14. The method according to claim 7, wherein the pixels respectively comprise the thin film made from the pyroelectrically sensitive material, with which an approach of the part to each pixel and a withdrawal of the part from each pixel involve the respective signal deflections in S-shape, further comprising:
identifying of the shapes of the signal deflections and proceeding with the method if the shapes of the signal deflections respectively have the S-shape.

15. The method according to claim 14, wherein the temporal occurrence of the maxima and/or minima of the S-shaped signal deflections of the signals of the pixels are used for the identifying.

* * * * *